United States Patent [19]

Queriaud et al.

[11] Patent Number: 5,473,137
[45] Date of Patent: Dec. 5, 1995

[54] METHOD OF BONDING COPPER AND A SUBSTRATE FOR POWER ELECTRONICS AND MADE OF A NON-OXIDE CERAMIC

[75] Inventors: Roland Queriaud, Bretigny sur Orge; Alain Petitbon, St Arnoult en Yvelines, both of France

[73] Assignee: Societe Anonyme Dite Alcatel Alsthom Compagnie Generale d'Electricite, Paris, France

[21] Appl. No.: 82,448

[22] Filed: Jun. 25, 1993

[30] Foreign Application Priority Data

Jun. 29, 1992 [FR] France .................................. 92 07964

[51] Int. Cl.⁶ .................................................. B23K 26/00
[52] U.S. Cl. ................................. 219/121.64; 219/121.6; 219/121.69; 228/173
[58] Field of Search ........................ 219/121.11, 121.6, 219/121.61, 121.63, 121.64, 121.68, 121.69; 228/122, 195, 173; 427/314; 430/346

[56] References Cited

U.S. PATENT DOCUMENTS

| | | | |
|---|---|---|---|
| 3,596,045 | 7/1971 | Stiegerwald | 219/121.6 |
| 3,911,553 | 10/1975 | Burgess et al. | 228/195 |
| 3,994,430 | 11/1976 | Cusano et al. | 288/122 |
| 4,457,958 | 7/1984 | Lange et al. | 427/314 |
| 4,769,310 | 9/1988 | Gugger et al. | 430/346 |

FOREIGN PATENT DOCUMENTS

| | | |
|---|---|---|
| 0170012 | 2/1986 | European Pat. Off. . |
| 0233146 | 8/1987 | European Pat. Off. . |

OTHER PUBLICATIONS

Patent Abstracts of Japan, vol. 10, No. 164 (E–410) Jun. 11, 1986 & JP–A–61 016 530 (Matsushita Densi Kogyo KK) Jan. 24, 1986.

*Primary Examiner*—Tu Hoang
*Attorney, Agent, or Firm*—Sughrue, Mion, Zinn, Macpeak & Seas

[57] ABSTRACT

A method of bonding copper to a heat conducting and electrically insulating power electronics substrate made of a non-oxide ceramic selected from AlN, SiC, and BN, the method including the steps of oxidizing the surface of the substrate and then directly bonding copper to the oxidized surface of the substrate, wherein the step of oxidizing the surface of the substrate is performed by irradiating the surface using a laser beam to a thickness in the range 0.1 μm to 3 μm.

6 Claims, No Drawings

METHOD OF BONDING COPPER AND A SUBSTRATE FOR POWER ELECTRONICS AND MADE OF A NON-OXIDE CERAMIC

The present invention relates to a method of bonding copper to a substrate for power electronics and made of non-oxide ceramic, which method uses the technique commonly called "direct bond copper" (DBC). In the intended applications, the non-oxide ceramic conducts heat but is electrically insulating. It is selected, for example, from BN, SiC, AlN, . . . .

BACKGROUND OF THE INVENTION

DBC technology has been used in the electronics industry for bonding copper to alumina $Al_2O_3$ (cf. J. F. Burgess et al., "Hybrid packages by the direct bond copper process", Solid State Science and Technology, May 1975, pp. 40).

That technique is highly advantageous since it makes it possible to bond copper to the oxide without using an intermediate layer (e.g. solder) which in general reduces heat transfer. It is based on the formation of a copper-oxygen eutectic at 1065° C., as indicated in the following two articles:

J. F. Dickson, "Direct bond copper technology: materials, methods, applications", Int. J. Hybrid Microelectronics, 5 (2), 103–109 (1982); and J. E. Holowczak, V. A. Greenhut, O. J. Shanefield, "Effect of alumna composition on interfacial chemistry and strength of direct bonded copper-alumina", Ceram. Eng. Sci. Proc. 10 [9–10], pp. 1283–1294 (1989).

The copper is placed in contact with the ceramic and they are heated together to a temperature lying in the range 1065° C. (eutectic temperature) to 1083° C. (copper melting temperature) in an inert atmosphere. The oxygen required for forming the eutectic may be injected directly into the atmosphere or else it may be provided by previously oxidizing the copper. At the treatment temperature, the resulting liquid wets both the ceramic and the copper, thus forming a bond between the two antagonists, after cooling. A copper aluminate is also formed, reinforcing the adherence of the copper.

Although that technique has been applied until now essentially to alumina, it is known that it is also capable of bonding copper to silica, to beryllium oxide (BeO), to sapphire, or to certain compounds of the spinel type, all of which materials are oxides.

The new high thermal conductivity ceramics for power electronics, such a aluminum nitrate (AlN) for example, can be bonded to copper by that technique only if they are previously surface oxidized. Non-oxides (such as AlN) are not wetted by copper or by the CuO eutectic, and it is not possible to form a copper aluminate.

The surface oxidizing of aluminum nitride with aluminate is a major parameter that conditions the quality with which copper adheres to aluminum nitride, as mentioned in European patent application EP-A-170 012 and in the following two articles:

P. Kluge-Weiss, J. Gobrecht, "Direct bonded copper metallization of AlN substrates for power hybrids", Mat. Res. Soc. Symp. Proc. 40 (1985); and W. L. Chiang, V. A. Greenhut, D. J. Shanefield, L. Sahati, R. L. Moore, "Effect of substrate and pretreatment on copper to AlN direct bonds", Ceram. Eng. Sci. Proc. 12 [9–10], pp. 2105–2114 (1991).

In particular, too great a thickness of the resulting alumina layer gives rise to stresses between AlN and $Al_2O_3$, thereby reducing the quality of the subsequent Cu—AlN bond. The thickness of the oxide layer must be as small as possible, but must nevertheless remain sufficiently large since this layer is completely dissolved in the Cu—O eutectic if less than 0.1 µm thick.

Until now, the nitride has been oxidized in an oven under air or under oxygen at temperatures greater than 1100° C. for periods of time exceeding 1 hour. The method is lengthy and it does not enable oxidizing to be performed selectively at precise locations on the surface of the aluminum nitride. In addition, the method cannot be applied to thin layers of aluminum nitride or to thick layers that are supported by oxidizable substrates.

OBJECT AND SUMMARY OF THE INVENTION

An object of the present invention is to provide surface oxidizing on a non-oxide ceramic substrate in a manner that is more accurate and more rapid, so as to make it subsequently easy to bond it to copper using the DBC technique.

The present invention provides a method of bonding copper to a heat conducting and electrically insulating power electronics substrate made of a non-oxide ceramic selected from AlN, SiC, and BN, the method consisting in oxidizing the surface of the substrate and then in using the direct bond copper technique (DBC), wherein the operation of oxidizing the surface of the substrate is performed by irradiating the surface concerned using a laser beam and to a thickness lying in the range 0.1 µm to 3 µm.

By this method, only the zone concerned by the DBC bond is thus subjected to the oxidizing treatment, and this treatment is done to a controllable thickness.

The laser may be continuous or pulsed, selected from an excimer laser, a yttrium aluminum-garnet (YAG) laser, and preferably a $CO_2$ laser.

Advantageously, the laser beam is a continuous beam having a diameter lying in the range 0.5 mm to 10 mm, having power lying in the range 50 watts to 3 kwatts, with the duration of the treatment lying in the range 1 ms to 3 seconds.

The treated zone is thus defined with great accuracy and the treatment is very rapid.

It is possible to work in air, but a flow of gaseous oxygen is preferably directed onto the treated surface coaxially with the laser beam.

The laser beam is preferably homogenized, e.g. with a kaleidoscope.

The diameter of the above-defined beam may be adjusted by an optical focusing device.

To avoid any risk of degradation of the oxide layer obtained by the treatment of the invention, and in particular degradation by cracking, it may be advantageous in some cases to preheat the substrate to a temperature of about 200° C. to 600° C. prior to the operation of oxidizing the surface of the substrate.

The preheating may be performed simply, for example, by means of resistance elements, and can serve to reduce troublesome thermal shocks.

In the above, the non-oxide ceramic substrate may be in the form of a thin layer or of a thick layer disposed on any kind of support which is then completely unaffected by the oxidizing treatment of the invention.

DESCRIPTION OF AN EMBODIMENT OF THE INVENTION

Other characteristics and advantages of the present invention appear from the following description of an embodiment given by way of non-limiting illustration.

The starting material was a 1.5 mm thick substrate of aluminum nitride. It was preheated by means of a resistance element placed beneath the substrate and it reached a temperature of 400° C.

A flow of oxygen was applied perpendicularly to the surface of the substrate to be treated at a rate of 3 m$^3$/hour.

The beam used came from a continuous $CO_2$ laser having a power of 1700 watts. It was homogenized by a kaleidoscope so that the spot for treating the substrate was square in section, having a side substantially equal to 5 mm. Using a treatment time of 1 second, homogeneous surface oxidation was obtained over a thickness substantially equal to 0.5 μm.

Naturally the invention is not limited to this embodiment. In particular, it applies to other non-oxide ceramics.

We claim:

1. A method of bonding copper to a heat conducting and electrically insulating power electronics substrate made of a non-oxide ceramic selected from AlN, SiC, and BN, the method comprising steps of oxidizing the surface of said substrate and then directly bonding copper to the oxidized surface of said substrate, wherein the step of oxidizing the surface of said substrate is performed by irradiating the surface using a laser beam to a thickness in the range 0.1 μm to 3 μm.

2. A method according to claim 1, wherein said laser beam is selected from excimer, yttrium aluminum-garnet, and $CO_2$ lasers that are continuous or pulsed.

3. A method according to claim 1, wherein said laser beam is a continuous infrared laser beam, having a diameter in the range 0.5 mm to 10 mm, having power in the range 50 watts to 3 kwatts, and with the duration of the oxidizing step in the range 1 ms to 3 seconds.

4. A method according to claim 2, wherein a flow of gaseous oxygen is applied to the surface coaxially with said laser beam.

5. A method according to claim 2, wherein said laser beam is homogenized.

6. A method according to claim 1, wherein prior to said oxidizing the surface of said substrate, the substrate is preheated to a temperature of about 200° C. to about 600° C.

* * * * *